United States Patent
Geng et al.

(10) Patent No.: US 9,350,348 B1
(45) Date of Patent: May 24, 2016

(54) POWER MANAGEMENT SYSTEM FOR INTEGRATED CIRCUITS

(71) Applicants: Xiaoxiang Geng, Suzhou (CN); Lei Zhang, Suzhou (CN)

(72) Inventors: Xiaoxiang Geng, Suzhou (CN); Lei Zhang, Suzhou (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/693,884

(22) Filed: Apr. 23, 2015

(30) Foreign Application Priority Data

Dec. 8, 2014 (CN) .......................... 2014 1 0858171

(51) Int. Cl.
*H03L 7/00* (2006.01)
*H03K 19/00* (2006.01)
*H03K 5/1534* (2006.01)

(52) U.S. Cl.
CPC .......... *H03K 19/0016* (2013.01); *H03K 5/1534* (2013.01)

(58) Field of Classification Search
CPC .................. H03K 5/1534; H03K 19/0016

USPC ......................................................... 327/143
See application file for complete search history.

(56) References Cited

U.S. PATENT DOCUMENTS

| | | | |
|---|---|---|---|
| 7,149,605 B2 | 12/2006 | Chassin | |
| 7,430,459 B1 | 9/2008 | Papalia et al. | |
| 7,940,094 B2 * | 5/2011 | Takeuchi | H03K 17/223 327/143 |
| 8,766,491 B2 | 7/2014 | Fleck | |

\* cited by examiner

*Primary Examiner* — Jeffrey Zweizig
(74) *Attorney, Agent, or Firm* — Charles E. Bergere (57) ABSTRACT

A power management circuit for integrated circuits operating systems where the power supply may be marginal includes a supply voltage characterization circuit and a clock synthesis circuit. The supply voltage characterization circuit determines the strength of the supply voltage applied to the IC and provides information to the synthesis circuit that is used to adjust the clock frequency of the IC to insure the IC does not draw too much current and force the IC into reset. A counter is used to determine the time between when the supply voltage reaches a first level and a second higher level, the time being representative of the slope of the supply voltage. Knowledge of the characteristics of a portion of the circuit under certain operating or benchmark conditions may be used to adjust the characterization.

18 Claims, 6 Drawing Sheets

POWER MANAGEMENT SYSTEM FOR INTEGRATED CIRCUITS

BACKGROUND OF THE INVENTION

The present invention relates generally to integrated circuit power management, and more particularly to methods of monitoring power supply quality and adjusting integrated circuit power usage correspondingly.

Modern integrated circuits (ICs) are used in a variety of environments. In some of these environments, e.g., building control and management facilities, large circuit boards or electronic systems such as supercomputers, and vehicle distributed sensor and control systems, the power supply voltage supplied to the ICs can be compromised by a number of factors, such as the distance of the ICs from the power supply source and the number of other ICs in the general vicinity of a specific integrated circuit to be powered, the topology of the power supply distribution network (e.g., point-to-point or star), and the states of the various ICs.

The state of an IC can determine the amount of power it draws. For example, a microprocessor that is in an idle state may draw less power than one that is actively doing calculations. A wireless transmission IC that is attempting to establish a connection (e.g., with a wireless hub or cellular radio tower) typically engages in power ranging, which may draw more power from a power supply than when the IC is either not transmitting or has already acquired a nearby connection.

Additionally, an IC that is powering up may draw more power initially than it does during its steady state operation. Accordingly, a well-known problem associated with IC power management in systems that include many ICs is managing the simultaneous startup of a number of ICs at the same time.

Figure 1:
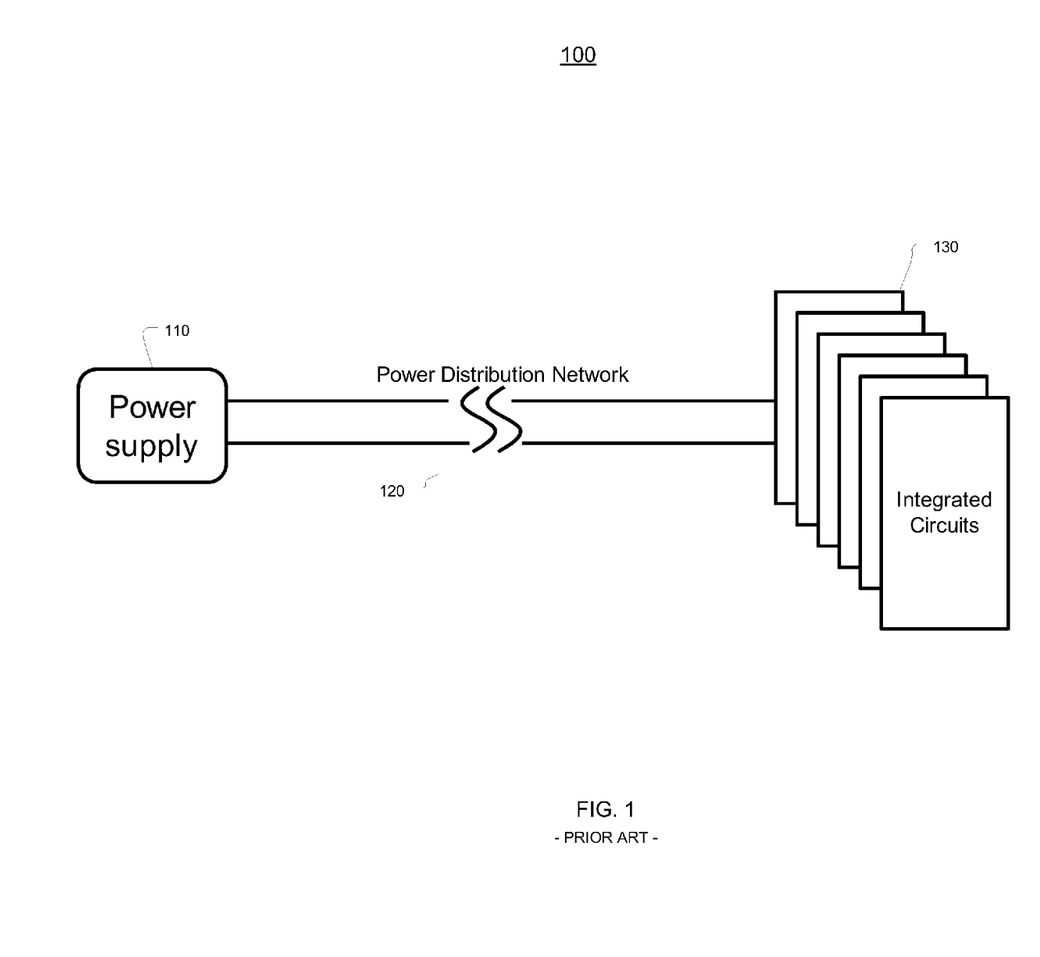
FIG. 1 is a simplified schematic block diagram of a conventional electronics system that includes multiple ICs.

FIG. 1 is a block diagram of a typical electronics system 100 that includes multiple ICs. The system 100 includes a power supply 110, a power distribution network 120, and a plurality of ICs, such as the integrated circuit 130. In operation, the power supply 110 provides power to the network 120, which in turn provides the power to the integrated circuits, such as the integrated circuit 130.

The power supply 110 may be centralized or distributed and may be singled ended or differential. The power distribution network 120 may be a point-to-point, mesh, grid, star, or other topology. In general, the power distribution network 120 will exhibit resistive, inductive, and capacitive properties as will the ICs.

As a result, when power is applied to the system 100, the integrated circuit 130 might not immediately see the full voltage of the power supply 110 but rather will see a gradual rise in the voltage as capacitive elements are charged through resistive elements of the power distribution network 120. Inductive elements may also contribute to ringing and/or overshoot voltages, particularly immediately following the turning on of the power supply 110. Some power supplies are designed with inrush current limiting circuitry to "slow start" systems for these and other reasons.

Figure 2:
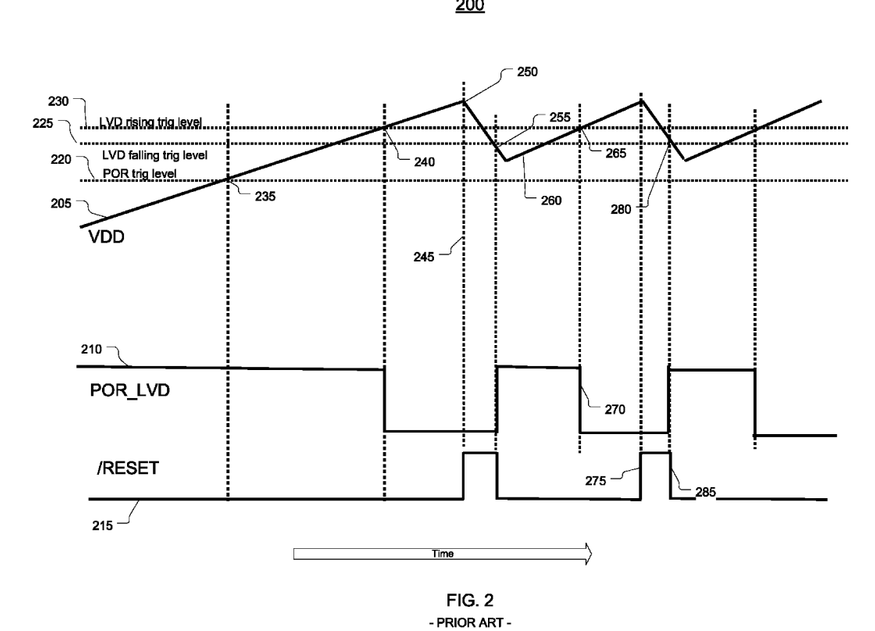
FIG. 2 is a simplified signal timing diagram associated with signals within one of the ICs of FIG. 1 as a function of time and supply voltage.

FIG. 2 is a signal timing diagram 200 associated with signals within an IC (such as the IC 130 of FIG. 1) as a function of time and supply voltage. The timing diagram 200 depicts on the vertical axis (a) a voltage level VDD 205 in the upper portion of the diagram 200, as well as, in the lower portion, (b) a power-on reset low-voltage detect (POR_LVD) signal 210 and (c) an overall IC reset signal /RESET 215. Time is shown to increase from left to right.

The upper portion of the timing diagram 200 also shows several reference voltages. The timing diagram 200 shows (a) a POR trigger level (PTL) 220, (b) an LVD falling trigger level (LFTL) 225, (c) and an LVD rising trigger level (LRTL) 230.

VDD initially starts out very low, as depicted at the left hand side of the timing diagram 200, but as time passes, VDD starts to increase. VDD first crosses the reference voltage PTL 220 at the time 235. At this voltage level, the IC 130 has enough power to operate basic circuits such as band-gap references and other threshold detectors but full functionality is disabled by the /RESET signal 215 being held low.

As more time passes, VDD crosses the LRTL 230 at the time 240. This crossing triggers the power on reset low voltage crossing detection mechanism for the IC 130, causing the POR_LVD 210 to de-assert and the IC to start a countdown to full functionality (e.g., a countdown to starting its system clock).

At the time 245, the timer expires (e.g., a counter that is clocked by an internal power-up clock overflows) and the signal /RESET is de-asserted (i.e., is driven high) allowing full operation of the IC 130 to start.

However, in a typical scenario where the IC 130 is far from the power supply 110, is surrounded by other similar ICs, and/or has a high initial startup current requirement, the voltage VDD 205, reaches a peak voltage 250, and then begins to decrease as more current is drawn than the power supply 110 can provide.

In many cases, VDD will drop below the LVD falling trigger level 225 (e.g., as shown happening at the time 255), causing the power-on low-voltage detection circuitry to de-assert the POR_LVD 210 (also shown happening at the time 255), and consequently forcing the assertion of /RESET (at the time 255) leading to the corresponding reset of the integrated circuit 130.

As a result of the reset of the circuit 130, the integrated circuit's clock is stopped, and the integrated circuit halts operation. Similar ICs on the same power distribution network 120 may also be forced back into reset, and the current draw from the power supply 110 will be reduced, and correspondingly VDD may be seen to start rising again (e.g., as illustrated at the point 260).

Once VDD again reaches the LRTL 230 at the time 265, the POR_LVD 210 is de-asserted (270), the timer again starts running, and the IC 130 is poised to repeat the potentially infinite cycle of (a) coming out of reset (i.e., de-asserting /RESET at the time 275), (b) drawing too much current, and (c) forcing a low voltage threshold crossing at the time 280, and (d) leading to reassertion of /RESET at the time 285.

Thus, it would be advantageous to be able to supply power to multiple ICs in a system without causing inadvertent resets in the ICs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION OF THE INVENTION

Detailed illustrative embodiments of the present invention are disclosed herein. However, specific structural and functional details disclosed herein are merely representative for purposes of describing example embodiments of the present invention. The present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 3:
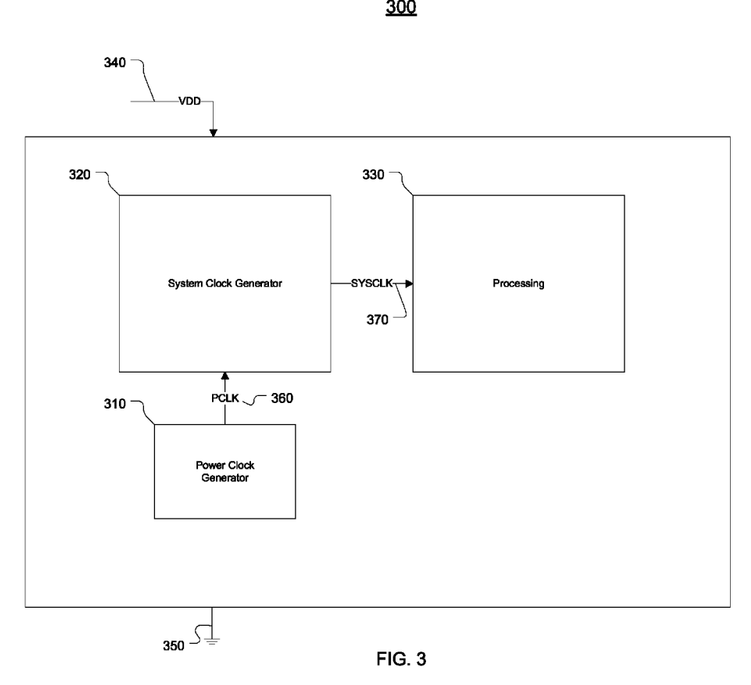
FIG. 3 is a simplified schematic block diagram of an IC according to an embodiment of the present invention.

FIG. 3 is a simplified block diagram of an IC 300 according to an embodiment of the present invention. The IC 300 includes a power clock generator 310, a system clock generator 320, and a processing block 330. The IC 300 is connected to a power supply VDD 340 and a ground 350.

In operation, the power clock generator 310 outputs a power clock (PCLK) 360 to the system clock generator 320. The system clock generator 320 uses the PCLK 360 to operate a power counter that is used to determine the frequency for an optimum system clock SYSCLK 370. The SYSCLK 370 is output from the system clock generator 310 to the processing circuit 330 where it is used to "clock" the core logic of the IC 300.

Figure 4:
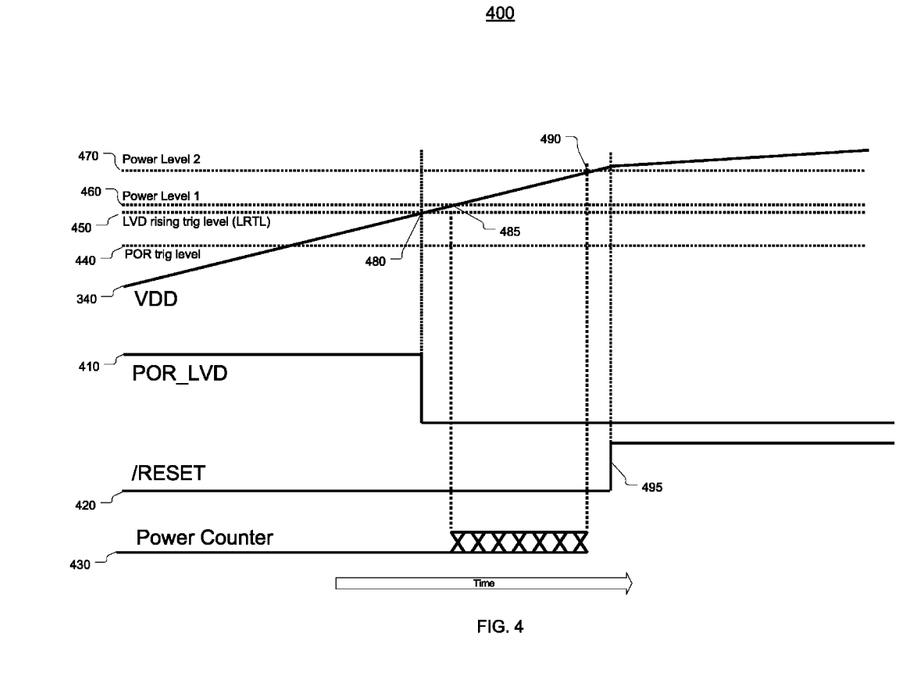
FIG. 4 is a simplified signal timing diagram associated with signals within the IC of FIG. 3 as a function of time and supply voltage according to an embodiment of the present invention.

FIG. 4 is a simplified signal timing diagram 400 associated with signals within the system clock generator 320 of the IC 300 of FIG. 3 according to an embodiment of the present invention. The timing diagram 400 reflects the values of various signals over time as a function of the supply voltage VDD 340.

The variations of the VDD 340 reflect the environment of the IC 300. For example, the IC 300 may be used (i) in a sensor/control network within an automobile, ship, airplane, building, or train or (ii) in a distributed industrial control process network within a factory or plant. In these environments, the supply voltage may be constrained and exhibit non-ideal characteristics that may be modeled as reflective of a power supply with high internal resistance and various capacitive and inductive attributes.

On the vertical axis, the timing diagram 400 depicts (a) the supply voltage level VDD 340 in the upper portion of the diagram, and, in the lower portion, (b) a power-on reset low-voltage detection (POR_LVD) signal 410, (c) an overall IC reset signal /RESET 420, and (d) a power counter signal 430. Time is indicated to increase from left to right.

Also shown in the upper portion of the timing diagram 400 are reference voltages (a) a POR trigger level (PTL) 440, (b) an LVD rising trigger level (LRTL) 450, (c) a Power Level 1 460, and (d) a Power Level 2 470.

VDD initially starts out very low, as depicted at the left hand side of the diagram, but, as time passes, VDD starts to increase. The slope or rise time of VDD is a function of the strength of the power supply of the system, the loading of the system, and the resistance, inductance, and capacitance (RLC) characteristics of the power distribution network that feeds the IC 300.

In general, if the power supply is strong (e.g., if it can maintain close to its rated open-circuit voltage while supplying as much current as the IC 300 needs), then the power supply will exhibit a sharp positive slope over time. If the power supply is weak, then the power supply will exhibit a slow ramp and a shallow slope and may take a longer time to reach its full rated voltage, or the power supply may never reach its full rated voltage due to internal or power distribution network related impedance.

As the voltage VDD 340 rises above the PTL 440, some subsystems of the IC 300 begin to operate. In particular, internal voltage references, threshold detectors, one-shots, and comparators become operative. By the time VDD reaches the LRTL 450, the integrated circuit 300 is able to determine that the low-voltage detection rising-trigger level 450 has been reached, and, in response, the IC 300 de-asserts the POR_LVD 410 (i.e., drives the signal low) at the time 480.

When the supply voltage VDD 340 reaches the Power Level 1 460 at the time 485, a power counter (not shown) within the system clock generator 320 of FIG. 3 is started, and, when VDD reaches the Power Level 2 470 at the time 490, the power counter is stopped. Since the slope or rise of the supply voltage VDD 340 is a function of the characteristics of the power supply, the power distribution network, and the IC 300 and its neighboring electronics, measuring the slope can provide insight into those characteristics.

Since the Power Level 1 460, the Power Level 2 470, and the duration of each step of the counter are known, the final count value of the counter may be used to estimate the slope of the power supply voltage VDD and thereby approximate the strength of the local power supply to the IC 300.

Note that in various embodiments, the first reference voltage Power Level 1 460 may be eliminated and the power counter 430 started automatically as the VDD 340 rises above LRTL 450. Once it reaches Power Level 2 470, the counter is stopped and the count is noted and used as an indicator of the slope characteristic of the power supply in determining the system clock frequency.

In general, if the power supply is strong, then the counter value will be small. Alternatively, if the power supply is weak, then the counter value may be large.

Similarly, for the same power supply, if the integrated circuit 300 consumes a lot of power, the slope of the voltage rise of the VDD 340 will be shallower than if the IC 300 uses very little power. Correspondingly, the counter value will be smaller for a low power IC than it will for a power-hungry one.

After the final count value is determined, it is fed to the system clock generator 320 to determine an optimum frequency for the system clock (e.g., the SYSCLK 370 of FIG. 3) at which the IC 300 may be operated. Operating the IC 300 at the optimum frequency may avoid current being overdrawn from the power supply and thereby avoid the power supply voltage VDD 340 from dropping below a critical threshold for circuit operation, such as an LVD falling trigger level (not shown) or the POR trigger level 440.

As illustrated by the leveling off of the VDD 340 in FIG. 4, at the time 495, the IC 300 starts operation at the calculated optimum SYSCLK frequency, and the supply voltage levels out, asymptotically reaching a steady state voltage (not shown) for the system and ideally not later significantly decreasing under steady state IC operating conditions.

Figure 5:
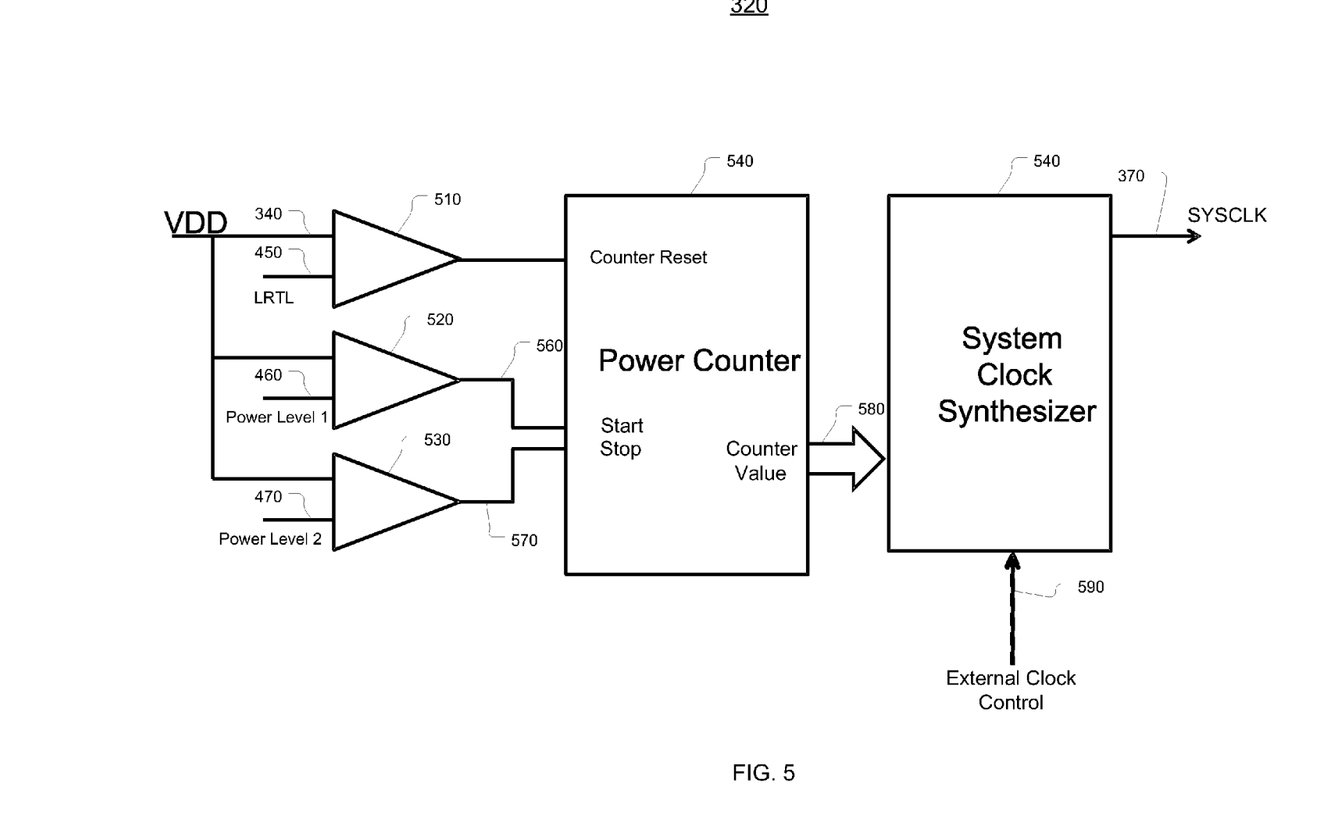
FIG. 5 is a simplified schematic block diagram for one possible embodiment of the system clock generator of FIG. 3 according to an embodiment of the present invention.

FIG. 5 is a simplified block diagram for one possible embodiment of the system clock generator 320 of FIG. 3. The system clock generator 320 includes one-shots 510, 520, and 530, a power counter 540, and a system clock synthesizer 550.

In operation, when power is applied to the IC 300, the voltage VDD 340 starts to rise, and circuitry (not shown) within the IC 300 stabilizes the threshold voltages, e.g., the POR Trigger Level 440, the LRTL 450, the Power Level 1 460, and the Power Level 2 470, the latter three of which are wired to the one-shots 510, 520, and 530, respectively.

Next, the one-shot 510 compares the voltage VDD 340 with the LRTL voltage 450, and, if the VDD 340 exceeds the LRTL voltage 450, then the one-shot 510 outputs a reset pulse to the counter 540 to reset the counter's count to zero.

As VDD continues to rise, at some point, VDD exceeds the Power Level 1 460 and triggers the one-shot 520 which outputs a counter start pulse 560 to the power counter 540.

As a function of the power supply characteristics, VDD continues to rise and eventually exceeds the Power Level 2 470, thereby triggering the one-shot 530. The one-shot 530 then outputs a counter stop pulse 570 to the power counter 540, which pulse stops the counter at a counter value that is representative of the slope of the power supply voltage VDD 340.

The counter value is output via the wire 580 to the system clock synthesizer 550 where the counter value is used to generate an optimized frequency for the SYSCLK 370, which clock is driven to the processing circuitry 330 within the integrated circuit 300. For example, the counter value may be used to determine a value to be loaded into a register associated with a programmable frequency synthesizer within the system clock synthesizer 550, which, along with other inputs and hardware, will determine the frequency of the SYSCLK 370.

Once SYSCLK is stable, the processing circuitry 330 is taken out of reset by de-assertion of the /RESET.

In some embodiments, the External Clock Control signal 590 may be used to modify or override the counter value 580 supplied by the power counter 540 to the system clock synthesizer 550. In such embodiments, the External Clock Control 590 signal may be generated by an external device that is monitoring supply voltages for the facility that the IC 300 is operating within. In other embodiments, the one-shots 510, 520, and 530 as well as the power counter or similar voltage supply characterization hardware may be implemented external to the IC 300, used to determine an External Clock Control, and fed into the IC 300 from outside. The External Clock Control 590 may be a counter value similar to the one supplied by the power counter 540 or the External Clock Control 590 may be, for example, an offset value to be added or subtracted from a counter or default value, an override signal, or an instruction. The External Clock Control 590 may be carried, for example, by a serial or parallel or network interface.

Alternatively, the optimum frequency that is determined from the slope analysis may be used to set a soft maximum SYSCLK frequency for the system that may be optionally allowed to be overcome by software override. For example, a user or supervisor request to load a value for clock frequency that is higher than the optimum frequency set by the system clock generator 550 may cause a system interrupt to be issued that may be optionally masked (i.e., ignored) or unmasked and operative to override the higher frequency request.

In some embodiments, alternative methods may be used to determine the power supply characteristics and to set the optimum clock frequency. For example, in one embodiment, a known load, such as a benchmark processing routine applied to the circuit at a given "test" SYSCLK frequency, is used when determining the slope of VDD. The results of the slope determination under known load are then used to determine an operating optimum value for the SYSCLK frequency.

In another embodiment, all but one or a few well-characterized sub-circuits of the IC 300 are disabled, and the slope is measured when only the well-characterized circuits are drawing current.

In another embodiment, multiple slope measurements are taken, each under different operating conditions, such conditions established by (a) varying the operating frequency of the system, (b) varying the number of gates involved (e.g., enabling or disabling various sub-circuits of the integrated circuit), or (c) running specific benchmark routines.

In other embodiments, different frequencies are determined for different sub-circuits, or different modes of operation, or different phases of power-on reset or operation. For example, non-volatile memory operating at one frequency may consume more power than processing logic operating at that same frequency. Because current draw at startup of an IC may be the most significant, particularly in the environment of other ICs concurrently starting up, it may be beneficial to adjust the clock frequency of the non-volatile memory during initialization relative to that of other logic.

In still other embodiments, alternative methods for determining the strength of the power supply may also be used to set the optimum system clock frequency. For example, an analog-to-digital converter (A/D) may be used to sample VDD at known points in time, and a slope of VDD or similarly the relative strength of the power supply may be determined by a smoothing of the potentially non-linear samples received by sampling of a possibly noisy supply voltage.

In still other embodiments, a feedback mechanism may be used to determine the optimum operating frequency. In these embodiments, a test system clock frequency is used to start operation, and the effect on slope is used to refine the test system clock frequency until an optimum frequency value is determined that is ultimately used for system operation. In such an embodiment, the test system clock frequency may be used prior to full operation of the IC.

Figure 6:
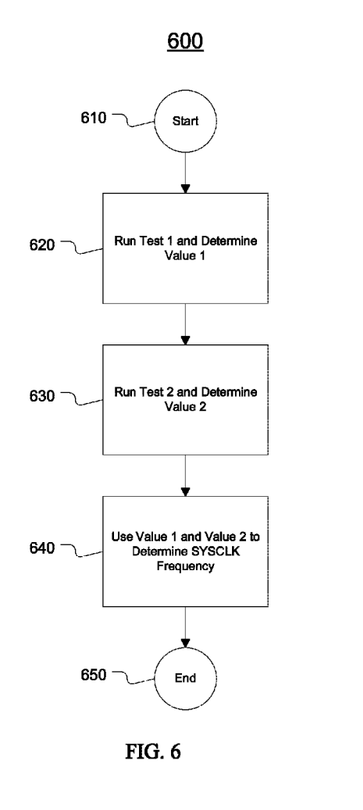
FIG. 6 is a flow chart for the operation of the system clock generator according to an embodiment of the present invention.

FIG. 6 is a flow chart 600 representing an embodiment of power management according to one embodiment of the present invention. The process begins in step 610. In step 620, a first test is run to determine a first value related to VDD.

For example, in step 620, following power-on, a counter may be held in reset until a first known voltage level is reached by the power supply voltage VDD (e.g., the Power Level 1 460 of FIG. 4). Once the power supply voltage VDD reaches the first known power level, a counter is started at a known frequency. Here, the first value is the time 0.

Next, in step 630, a test is done to see if the power supply voltage has reached a second known voltage level (e.g., the Power Level 2 470 of FIG. 4). When the power supply voltage has reached this level, the counter is stopped, and the second value extracted is the counter value.

Next, in step 640, the counter value is used along with the two known voltage levels to determine a change in power supply voltage vs. time characteristic of the power supply. Using this information and knowledge of the relative current draw of the IC under the power-up period, a calculation can be performed to determine an optimum SYSCLK frequency by extrapolation. In general, if the slope is large, then a faster SYSCLK frequency may be chosen. If the slope is small (shallow), then a slower SYSCLK frequency may be chosen. The process completes in step 650.

In some embodiments, the counter value may be used as a lookup address in a table of programmable clock synthesizer input values that have been determined empirically. In other embodiments, the counter value may be added to an offset or multiplied by a factor before being used either as a lookup or directly for setting the clock synthesizer.

In an alternative embodiment, in step 620, a first sub-circuit may be run in isolation at a first frequency where the current draw or loading of the sub-circuit at that frequency is known in advance of the test. Next, a sample of the supply voltage is taken to determine a first VDD value.

In step 630, the test may be run again but at a second frequency where the current draw or loading of the sub-circuit is again known in advance of the test. The supply voltage is again sampled to determine a second VDD value.

In step 640, the two different measured VDD values are used along with the two known current draw values to calculate a VDD vs. current slope that is characteristic of the power supply. This slope is then used to predict the supply voltage under full current load of the chip at the various operating frequencies, and an optimum frequency is chosen for operation that will keep VDD within the acceptable voltage level for operation.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

In the following claims, the term "circuit" is used to describe various embodiments of the invention and should be understood to include physical hardware and/or firmware and/or software. Additionally the physical hardware should be understood to comprise analog and/or digital components.

The invention claimed is:

1. A power management system for an integrated circuit, the power management apparatus comprising:
  a supply voltage characterization circuit configured to determine a first value that is representative of a characteristic of a supply voltage applied to the integrated circuit and a second value that is representative of a characteristic of the supply voltage; and
  a clock synthesis circuit, operatively coupled to the supply voltage characterization circuit, that receives and uses the first value to generate a clock with a first frequency used to clock logic within at least a portion of the integrated circuit, receives the second value, and uses both the first and second values to generate the first frequency.

2. The power management system of claim 1, wherein the first value is representative of a slope characteristic of the supply voltage.

3. The power management system of claim 2, wherein the first value represents a period of time.

4. The power management system of claim 3, wherein the first value is an output of a counter.

5. The power management system of claim 1, wherein each of the first and second values represents a period of time.

6. The power management system of claim 1, wherein at least one of the first and second values represents a sample of the supply voltage.

7. The power management system of claim 1, wherein at least one of the supply voltage characterization circuit and the clock synthesis circuit is situated external to the integrated circuit.

8. The power management system of claim 1, wherein the portion of the integrated circuit is a non-volatile memory within the integrated circuit.

9. The power management system of claim 1, wherein the first frequency is below a frequency that the integrated circuit is specified to operate at when provided with manufacturer-recommended nominal power supply voltage.

10. A system clock generator for a portion of an integrated circuit, the system clock generator comprising:
  a first threshold voltage crossing detector;
  a second threshold voltage crossing detector;
  a timer; and
  a programmable clock synthesizer, wherein:
    following application of a supply voltage to the integrated circuit, the timer is used to determine a time value representative of the time from (a) when the supply voltage for the integrated circuit crosses the first threshold voltage to (b) when the supply voltage crosses the second threshold voltage, the first threshold voltage being less than the second threshold voltage, and wherein a frequency of the clock synthesizer is programmed as a function of the time value and the clock synthesizer is used to generate the system clock for the portion of the integrated circuit.

11. The system clock generator of claim 10, wherein the timer comprises a counter.

12. The system clock generator of claim 10, wherein the first threshold voltage is a low-voltage detection rising trigger level voltage.

13. The system clock generator of claim 10, comprising a low voltage detection rising trigger level voltage that is lower than the first threshold voltage, wherein when the low-voltage detection rising trigger level voltage is crossed by the supply voltage, the operation of the timer is enabled.

14. The system clock generator of claim 10, wherein at least one of the voltage crossing detectors is situated external to the integrated circuit.

15. The system clock generator of claim 10, wherein the portion of the integrated circuit is a non-volatile memory within the integrated circuit.

16. The system clock generator of claim 10, wherein, following the time (a) when the supply voltage for the integrated circuit crosses the first threshold voltage, a benchmark application is run on the portion of the integrated circuit at a test frequency.

17. The system clock generator of claim 10, wherein the current draw of the portion of the integrated circuit is known in advance of the time (a) when the supply voltage for the integrated circuit crosses the first threshold voltage.

18. The system clock generator of claim 10, comprising a third threshold voltage crossing detector, wherein a timer is used to determine a second time value representative of the time from (b) when the supply voltage crosses the second threshold voltage to (c) when the supply voltage crosses the third voltage threshold, the third threshold voltage being higher than the first and second threshold voltages, and wherein the frequency of the clock synthesizer is programmed as a function of the second time value.

* * * * *